(12) United States Patent
Celler

(10) Patent No.: US 7,605,055 B2
(45) Date of Patent: Oct. 20, 2009

(54) WAFER WITH DIAMOND LAYER

(75) Inventor: George K. Celler, Summit, NJ (US)

(73) Assignee: S.O.I.Tec Silicon on Insulator Technologies, Bernin (FR)

(*) Notice: Subject to any disclaimer, the term of this patent is extended or adjusted under 35 U.S.C. 154(b) by 280 days.

(21) Appl. No.: 11/142,345

(22) Filed: Jun. 2, 2005

(65) Prior Publication Data

US 2006/0276003 A1 Dec. 7, 2006

(51) Int. Cl.
*H01L 21/46* (2006.01)
(52) U.S. Cl. .................. 438/458; 257/E21.561
(58) Field of Classification Search ........... 438/455, 438/457, 458; 257/E21.561
See application file for complete search history.

(56) References Cited

U.S. PATENT DOCUMENTS

| | | | | |
|---|---|---|---|---|
| 5,374,564 | A | 12/1994 | Bruel | 437/24 |
| 6,100,166 | A * | 8/2000 | Sakaguchi et al. | 438/455 |
| 6,323,108 | B1 * | 11/2001 | Kub et al. | 438/458 |
| 6,964,914 | B2 * | 11/2005 | Ghyselen et al. | 438/458 |
| 6,982,210 | B2 * | 1/2006 | Ghyselen et al. | 438/459 |
| 2004/0175875 | A1 * | 9/2004 | Sung | 438/197 |

OTHER PUBLICATIONS

McGraw-Hill Dictionary of Scientific and Technical Terms, Sixth Edition, 2003, The McGraw-Hill Companies, Inc., p. 1633, 1641.*

Aspar et al.; "The generic natrue of the smart-cut process for thin-film transfer"; 2001; Journal of Electronic Materials; vol. 30; No. 7; pp. 834-840.*

Tong et al.;; Layer splitting process in hydrogen-implanted Si, Ge, SiC, and diamond; 1997; Applied Physics Letters; vol. 70; No. 11; pp. 1390-1392.*

Wolter et al.; "Direct fusion bonding of silicon to polycrystalline diamond"; 2002; Diamond and Related Materials; vol. 11; pp. 482-486.*

Wolter et al.; *Processing Routes for Direct Bonding of Silicon to Epitaxially Textured Diamond*; Diamond and Related Materials 12; 257-261; (2003).

Celler et al.; *Frontiers of Silicon-on-Insulator*; Applied Physics; 93; 9; 4955-4978; (2003).

Tong et al.; *Semiconductor Wafer Bonding: Science and Technology*; The Electrochemical Society; 1-99; (1999).

* cited by examiner

*Primary Examiner*—Matthew C. Landau
*Assistant Examiner*—Vicki B Booker
(74) *Attorney, Agent, or Firm*—Winston & Strawn LLP

(57) ABSTRACT

A method of manufacturing a wafer using a support substrate of a crystalline material. On the surface of the support substrate, a layer of a diamond is grown to form a first wafer in combination with the support substrate. A further substrate is bonded to the surface of the diamond layer, and a region of weakness is formed within the first wafer or the further substrate. Energy is then applied at the region of weakness to detach the structure into a first portion and a second portion.

19 Claims, 6 Drawing Sheets

WAFER WITH DIAMOND LAYER

FIELD OF THE INVENTION

The present invention relates generally to a wafer and a method for manufacturing a wafer with a crystalline layer. More particularly, the method includes growing a layer of diamond over a crystalline substrate.

BACKGROUND OF THE INVENTION

Methods of manufacturing silicon-on-insulator ("SOI") wafers are generally known in the semiconductor industry. These wafers can include, for example, an insulator layer of silica deposited on a support substrate, and a layer of silicon further provided on the insulator layer. It is also sometimes useful or advantageous to form diamond layers on support substrates. Diamonds advantageously exhibit electrical and thermal conductivity characteristics that are beneficial in semiconductor applications, for example, the ability to dissipate heat to avoid a build-up of heat on a wafer. A silicon layer can be further provided on the surface of the diamond layer to form a silicon-on-diamond ("SOD") wafer, as disclosed in *Processing Routes for Direct Bonding of Silicon to Epitaxially Textured Diamond*, Diamond and Related Materials 12, 257 (2003) by S. D. Wolter et al.

Several processes and techniques for transferring semiconductor layers are also generally known. These include, for example, the layer transfer technique reported in *Frontiers of Silicon-on-Insulator*, J. Appl. Phys. 93, 4955 (2003) by G. K. Celler et al. and based on the "SMART-CUT®" technology of Soitec S. A., which is known to those skilled in the art and descriptions of which can be found in a number of works dealing with wafer reduction techniques, such as U.S. Pat. No. 5,374,564. In the SMART-CUT® process, atomic species, such as ions, are implanted in a donor wafer to create a region of weakness therein before bonding of a receiving substrate to the donor wafer. After bonding, the donor wafer splits or is cut at the region of weakness. What is obtained therefore is, on the one hand, a donor wafer, stripped of a layer of its structure, and, on the other hand, a wafer comprising, bonded together, a removed thin layer of the donor wafer and the receiving substrate.

It is also known that a region of weakness can alternatively be formed in a wafer by forming a porous layer therein using the method known as ELTRAN® by Canon, described in U.S. Pat. No. 6,100,166. Additionally, various bonding techniques are generally known and include the method described in the reference entitled "Semiconductor Wafer Bonding: Science and Technology" (Interscience Technology) by Q. Y. Tong, U. Gösele and Wiley.

Thus, there is a need for a more efficient method of manufacturing a wafer that includes a diamond layer such that the wafer advantageously incorporates the desired heat dissipation properties of the diamond layer.

SUMMARY OF THE INVENTION

The present invention relates to producing a wafer with a diamond layer to exploit the advantageous characteristics thereof. A preferred method of manufacturing a wafer includes providing a surface on a support substrate of a first crystalline material and growing a layer of diamond on the surface of the support substrate to form a first wafer. The preferred method also includes providing a further substrate of a second material that is to be bonded to the first wafer and forming a region of weakness in either the first wafer or in the further substrate. The further substrate is bonded to the first wafer to provide a bonded structure such that the region of weakness defines first and second bonded structure portions of the bonded structure. The region of weakness is preferably formed by implantation of atomic species in the first wafer or the further substrate. The first bonded structure portion is detached from the second bonded structure portion at the region of weakness, preferably by applying energy at the region of weakness. Preferably, the region of weakness is formed in the first wafer.

The thickness of the diamond layer is preferably greater than about 10 microns. In the preferred method, the diamond layer has a sufficient thickness to define first and second diamond layer portions of which the second diamond layer portion has significantly fewer crystalline grains therein than the first diamond layer portion. The support substrate preferably includes a substantially monocrystalline first material and can include silicon. The further substrate also preferably includes a crystalline material, and more preferably, the crystalline material includes silicon. Preferably, the surface of the diamond layer is prepared to improve surface conditions for bonding to the further substrate.

In one embodiment, a support substrate of a crystalline first material at a surface thereof is provided on which a layer of diamond is grown to provide a first wafer. At least a portion of the diamond layer is transferred from the first wafer to a further substrate by preferably forming a region of weakness in the first wafer to define a transfer portion that includes at least a portion of the diamond layer. After bonding the first wafer to the further substrate, the transfer portion is transferred at the region of weakness to the further substrate by detachment from a remaining portion of the first wafer. Preferably, an insulator layer can be formed adjacent to the transfer portion. A conductor layer can also be formed adjacent the transfer portion. The method also preferably includes reusing the first wafer in the wafer manufacturing process by transferring another portion of the diamond layer of the first wafer to another further substrate.

Another embodiment includes providing a silicon substrate and forming a second region of weakness therein to define a silicon transfer portion of the silicon substrate. The silicon substrate is then bonded to the transfer portion of the further substrate to form a second bonded structure. The silicon transfer portion is transferred at the second region of weakness to the transfer portion of the further substrate by detachment from a remaining portion of the silicon substrate.

Another embodiment of the invention is a method for manufacturing a wafer that includes providing a surface on a support substrate of a first crystalline material and providing on the surface of the support substrate a transfer layer of a transfer polycrystalline material. The transfer layer has a density of crystalline grains and the transfer layer is grown to a sufficient thickness to define first and second portions of the transfer layer of which the second portion of the transfer layer includes significantly fewer crystalline grains therein than the first portion of the transfer layer. A first wafer is defined comprising the support substrate and the transfer layer. The preferred method also includes providing a further substrate that is to be bonded to the first wafer and forming a region of weakness in either the first wafer or in the further substrate. The further substrate is bonded to the first wafer to provide a bonded structure such that the region of weakness defines first and second bonded structure portions of the bonded structure. The first bonded structure portion is detached from the second bonded structure portion at the region of weakness to obtain the wafer. Preferably, the first material includes silicon, the transfer material includes diamond, and the further substrate includes silicon.

The invention thus provides a method for manufacturing a semiconductor wafer that includes a diamond layer and uses advantageous layer detachment techniques.

DETAILED DESCRIPTION OF THE PREFERRED EMBODIMENTS

Figure 1:
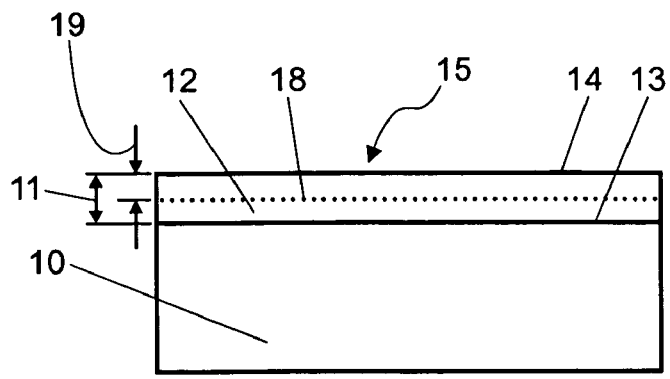
FIG. 1 shows an embodiment of the first wafer with a region of weakness formed in the diamond layer.
Figure 2:
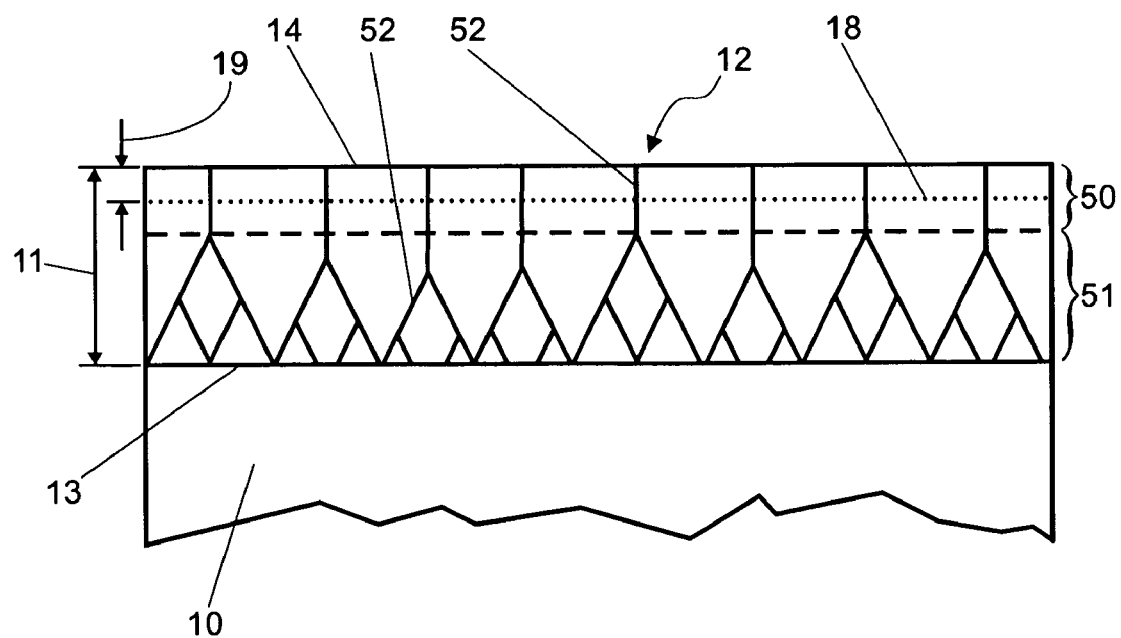
FIG. 2 shows details of the diamond layer of FIG. 1.

Referring to FIGS. 1 and 2, a preferred method of manufacturing a wafer includes providing a support substrate 10 having a surface 13 of a first crystalline material. A layer 12 of polycrystalline material is grown on the surface 13 of the support substrate 10 to form a first wafer 15 in combination with the support substrate 10. In the preferred embodiment, the polycrystalline layer 12 is made of diamond. Alternatively, the polycrystalline layer 12 can be made of silicon carbide, gallium nitride, or other suitable polycrystalline materials. Preferably, the first material of the support substrate 10 is substantially monocrystalline. More preferably, the first material is one of silicon, silicon dioxide (such as quartz crystal), silicon-germanium compounds, gallium nitride, gallium arsenide, or germanium. Even more preferably, the first material is silicon. It is advantageous to use a support substrate 10 that is made of one of the above-listed monocrystalline materials because the properties of these materials can be combined with the properties of the diamond layer 12 to form a crystallographically and thermodynamically stable first wafer 15.

The polycrystalline layer 12 grows as a textured polycrystalline layer on the surface 13 of the support substrate 10. In comparison to epitaxial growth, textured polycrystalline growth of a polycrystalline layer is relatively less random, i.e., the crystalline grains in the layer are more aligned and have a more preferred orientation. In contrast, epitaxial growth typically involves the growth of a single crystal layer on the surface of a single crystalline substrate and the growth of the crystalline grains therein is more random.

The polycrystalline layer 12 is preferably grown to an approximately even thickness 11 so that the layer has substantially consistent intrinsic properties to facilitate bonding to a bonded substrate. As the polycrystalline layer 12 is grown, a first portion 51 of the layer 12 typically grows as a polycrystalline structure, exhibiting a plurality of crystalline grains 52. As the thickness 11 of the layer 12 increases, the number of crystalline grains 52 in the layer decreases. The result is that a second portion 50 of the layer 12 tends to have a low defect layer that has significantly fewer crystalline grains 52 compared to the number of grains found in the first portion 51 of the layer 12. Because of the fewer number of crystalline grains 52, the second portion 50 of the layer 12 advantageously exhibits improved heat dissipation capabilities. This is desirable because semiconductor wafers typically generate heat during operation, and such heat must be dissipated to eliminate or reduce a build-up of hotspots thereon that could damage the structure of the wafer.

In the preferred embodiment, it is preferable to grow the diamond layer 12 to a thickness 11 greater than about 10 microns. More preferably, the diamond layer 12 is grown to a thickness 11 greater than about 50 microns, and in another embodiment, the thickness 11 is greater than about 100 microns. At these thicknesses, the number of crystalline grains 52 in the second portion 50 of the diamond layer 12 is significantly decreased.

After growth, the diamond layer 12 can have imperfections or irregularities on its surface 14. The surface 14 of the diamond layer 12 can be smoothed to preferably attain a smooth quality of the surface to enhance later bonding thereof to a bonded substrate. The surface 14 can be smoothed and prepared to facilitate a subsequent bonding step, for example, by applying a chemical-mechanical polishing process that is specially adapted for application to diamond surfaces. This process includes using a metal, such as iron, to react with the diamond layer at a high temperature caused by friction to produce a soft graphite as disclosed in U.S. Pat. Nos. 5,746,931 and 6,592,436. In another embodiment, only mechanical polishing is used for smoothing the surface 14 of the diamond layer 12. Alternatively, the surface 14 of the diamond layer 12 can be smoothed by coating the surface at elevated temperatures with a material that is flowable at these temperatures. Suitable flowable materials include, for example, boro-phospho-silicate glass, silica, or silicon. As the coating is applied, the material advantageously fills in any irregularities or non-uniformities on the surface 14 of the diamond layer 12.

Figure 3:
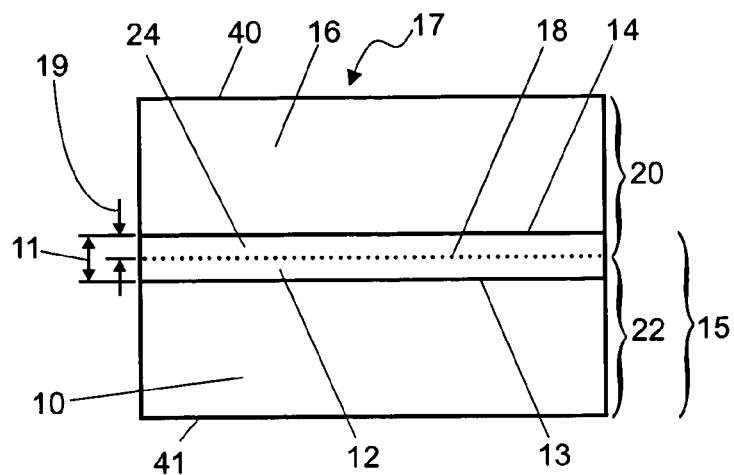
FIG. 3 shows a receiving substrate bonded to the first wafer of FIG. 1 to provide a bonded structure.

Referring to FIG. 3, the preferred method includes forming a region of weakness 18 in the diamond layer 12 of the first wafer 15 to transfer a portion 24 of the diamond layer to a receiving substrate 16, which will receive at least a portion of the diamond layer 12 after a transfer step. Preferably, the region of weakness 18 is formed at a predetermined depth 19. Preferably, the predetermined depth 19 is about 0.5 to about 3 microns from the surface 14 of the diamond layer 12. More preferably, the predetermined depth 19 is about 1 micron from the surface 14 of the diamond layer 12. Preferably, the region of weakness 18 extends generally planarly and in parallel with respect to the surface 14 of the diamond layer 12.

The region of weakness 18 preferably defines and separates a transfer portion 24 of the diamond layer 12 between the surface 14 and the region of weakness 18.

Preferably, the region of weakness 18 is formed by implanting a sufficient dose of atomic species through, for example, the surface 14 of the diamond layer 12 to the predetermined depth 19. The implantation of atomic species can include any suitable bombardment of atomic species, including molecular or ionic species, which can introduce the species through a surface with a maximum concentration of the species located at a predetermined depth from the surface. Suitable methods of atomic species implantation include using SMART-CUT® technology with an ion beam implanter or a plasma immersion implanter. Preferably, the ions include hydrogen ions, helium ions, or a co-implantation of both, however, ions of other noble gases can alternatively be used. Implantation of ions is advantageously a very accurate and efficient method for forming of the region of weakness 18.

The receiving substrate 16 of this embodiment is a bonded substrate, or further substrate, that is bonded to the surface 14 of the diamond layer 12 of the first wafer 15 to form a bonded structure 17. Alternatively, an insulator layer or conductor layer can be provided on the receiving substrate 16 for bonding to the surface 14 of the diamond layer 12. The bonding process advantageously allows good adhesion between the surface 14 of the diamond layer 12 and the receiving substrate 16 so that the transfer portion 24 of the diamond layer 12 adheres to the receiving substrate 16 upon detachment. Preferably, the bonding is performed by bringing the receiving substrate 16 into intimate contact with the smooth surface 14 of the diamond layer 12, advantageously effecting a molecular adhesion (wafer bonding) between the receiving substrate 16 and the surface 14. This bonding technique, as well as other variants, is described in the reference entitled "Semiconductor Wafer Bonding: Science and Technology" (Interscience Technology) by Q. Y. Tong, U. Gösele and Wiley. If necessary, bonding is accompanied by the application of a heat treatment to strengthen the bond between the receiving substrate 16 and the surface 14.

Preferably, the receiving substrate 16 includes silicon or other suitable materials that constitute a mechanical support sufficiently strong to support the transfer portion 24 and protect it from possible external mechanical stresses. Preferably, the receiving substrate 16 is silicon. The receiving substrate 16 can be of a single material or can include multiple layers.

After bonding, the region of weakness 18 preferably defines a first portion 20 and a second portion 22 of the bonded structure 17. The first portion 20 is preferably the portion of the bonded structure 17 between the surface 40 of the receiving substrate 16 and the region of weakness 18. Similarly, the second portion 22 is preferably the portion of the bonded structure 17 between the surface 41 of the support substrate 10 and the region of weakness 18.

Preferably, sufficient energy is applied to the bonded structure 17 at the region of weakness 18 to detach the first portion 20 from the second portion 22. The energy used to perform the detachment can be thermal, mechanical, and/or acoustic energy, for example. A suitable method for applying energy to the bonded structure includes using SMART-CUT® technology. Additionally, the bonded structure 17 can be subjected to heat treatment before detachment to further weaken the region of weakness 18. Preferably, this is accomplished by heating the bonded structure 17 at a temperature of between about 900° C. and about 1100° C.

Figure 4:
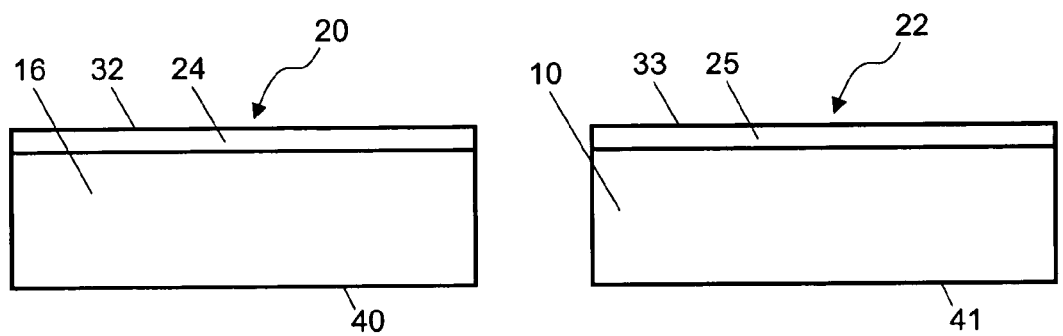
FIG. 4 shows first and second portions of the bonded structure of FIG. 3 after detachment.

As a result of the energy applied to the region of weakness 18, the first portion 20 and the second portion 22 are separated as shown in FIG. 4. The first portion 20 preferably includes the receiving substrate 16 and the associated diamond transfer portion 24 which has an exposed surface 32. In this embodiment, the receiving substrate 16 is the handling substrate, which is configured for allowing the handling of the transferred portion. The transfer portion 24 can advantageously retain the physical properties that are beneficial in semiconductor applications such as, for example, electrical and thermal conductivity, and in particular, improved heat dissipation. The second portion 22 of this embodiment is a donor wafer, from which a portion was transferred, and preferably includes the support substrate 10 and a remaining portion 25 of the diamond layer having an exposed surface 33.

The surfaces 32,33 often have an increased roughness after detachment. Thus, the surfaces 32,33 are preferably prepared to achieve a smooth quality of the surfaces. More preferably, the surfaces 32,33 are prepared, for example, by chemical etching, chemical-mechanical polishing, heat treatments, or other smoothing processes. Annealing can also be performed on the first portion 20 to strengthen the bond between the receiving substrate 16 and the transfer portion 24. Advantageously, finishing the surface 32 of the diamond transfer portion 24 results in a smooth surface that better enables the diamond layer to act as a heat dissipater to eliminate or reduce the build-up of hotspots on the first portion 20. Similarly, preparing the surface 33 of remaining portion 25 of the diamond layer enables the donor wafer 22 to be used again in the wafer manufacturing process according to the present invention without having to regrow the diamond layer. The smooth surfaces 32,33 also allow for the addition of other layers of materials thereon including, for example, an insulator layer, a conductor layer, a buffer layer, or a semiconductor layer.

Figure 5:
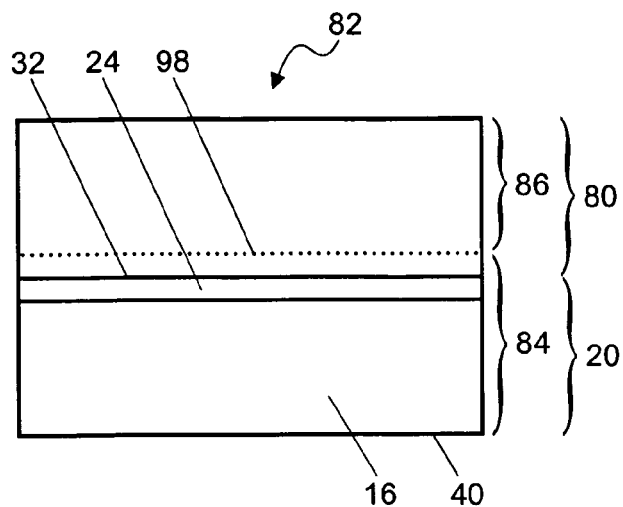
FIG. 5 shows an embodiment of a first portion of FIG. 4 after bonding to a silicon donor wafer to provide a bonded structure.
Figure 6:
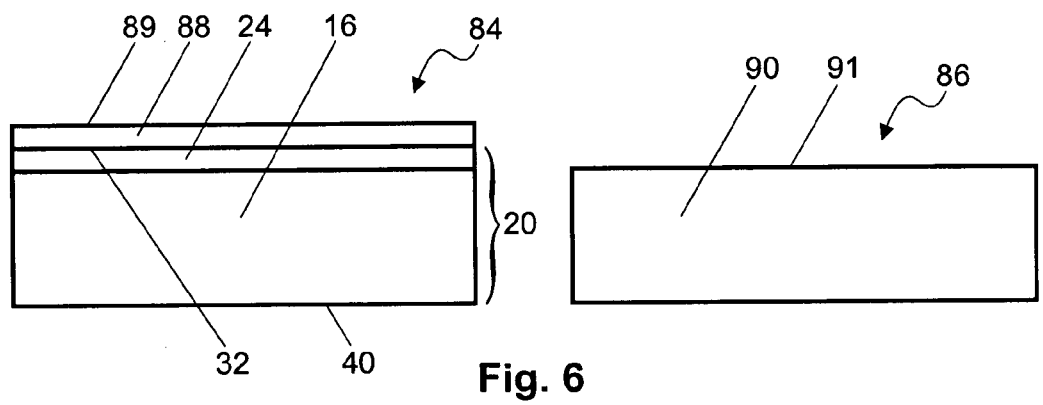
FIG. 6 shows first and second portions of the bonded structure of FIG. 5 after detachment.

In the most preferred embodiment, as shown in FIG. 5, the smoothed surface 32 of the first portion 20 is bonded to donor wafer 80 made of silicon, which has a region of weakness 98 formed therein, to form a bonded structure 82. The region of weakness 98 defines a first portion 84 and second portion 86 of the bonded structure 82. Energy is applied to the bonded structure 82 to detach the first portion 84 from the second portion 86, as shown in FIG. 6. Alternatively, the bonded structure 82 can be subjected to etching, grinding, or any other suitable process to grind the second portion 86 from the bonded structure 82 until only the first portion 84 of the bonded structure 82 remains.

Preferably, the first portion 84 includes the receiving substrate 16, the diamond transfer portion 24, and a silicon transfer portion 88 which has an exposed surface 89. In this embodiment, the receiving substrate 16 is the handling substrate that is configured for allowing the handling of the diamond transfer portion 24 and the silicon transfer portion 88, which is the active layer of the wafer. The surface 89 can be further smoothed, providing a SOD wafer, and can be further prepared for the addition of other layers thereon. The second portion 86 of this embodiment preferably includes the remaining portion 90 of the silicon donor wafer 80 having an exposed surface 91.

Figures 7, 8:
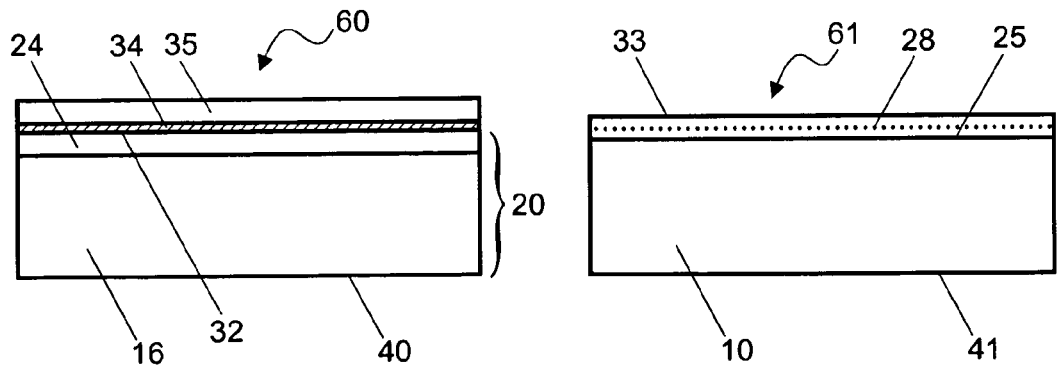
FIG. 7 shows an embodiment of a first portion of FIG. 4 after addition of other layers thereon.
FIG. 8 shows an embodiment of a donor wafer of FIG. 4 after formation of a second region of weakness in the remaining portion of the diamond layer.

Referring to the multilayer wafer 60 in FIG. 7, another embodiment includes adding additional layers to the first portion 20 of FIG. 4 to enhance or alter the electrical and thermal qualities of the wafer. In one embodiment, an insulator layer 34 is provided on the surface of a silicon substrate 35. The insulator layer 34 can include silica and can be provided, for example, by oxide deposition in or thermal oxidation of the silicon substrate 35, or by other suitable techniques known to one of ordinary skill in the art. The insulator layer 34 and the associated silicon substrate 35 can be bonded to the surface 32 of the transfer portion 24 to provide the multilayer wafer 60 in FIG. 7. In another embodiment, the insulator layer 34 can be deposited directly on the surface 32 of the transfer portion 24, and then a layer of silicon 35 can be bonded to the insulator layer 34.

FIG. 8 shows an embodiment of a donor wafer 61 that can be reused in the wafer manufacturing process where atomic species are implanted in the remaining portion 25 of the diamond layer after the first transfer is complete to form a second region of weakness 28 in the diamond layer. Thus, the donor wafer 61 can be subjected to further bonding to a second receiving substrate, for example, to form a second bonded structure, and detachment thereof, as previously described, is preferably performed. In another embodiment, the wafer can be reused by further growing the remaining portion 25 of the diamond layer to achieve a greater thickness before implantation, bonding, and detachment methods are performed. Preferably, the remaining portion 25 of the diamond layer is regrown to a thickness of at least about 10 microns, more preferably to a thickness greater than about 50 microns, such that a portion of the diamond layer exhibits the improved electrical and thermal properties.

Figure 9:
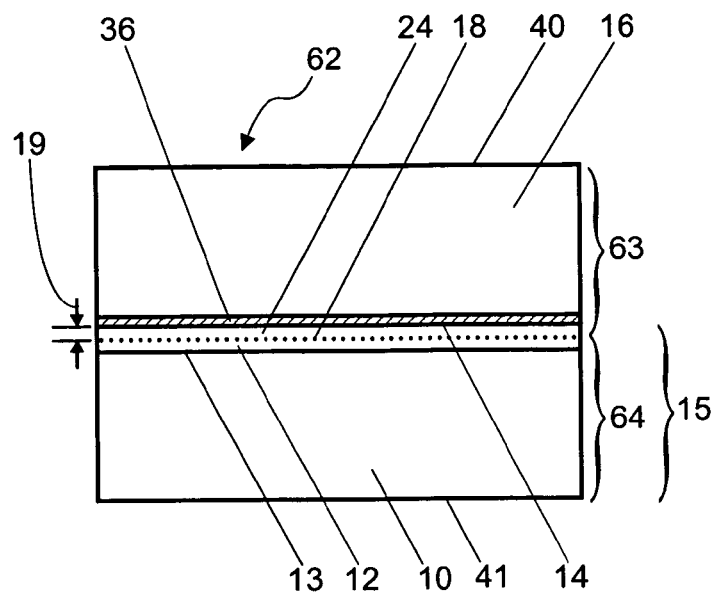
FIG. 9 shows an embodiment of a receiving substrate, with an insulator layer formed thereon, bonded to the first wafer of FIG. 1 to provide a bonded structure.
Figure 10:
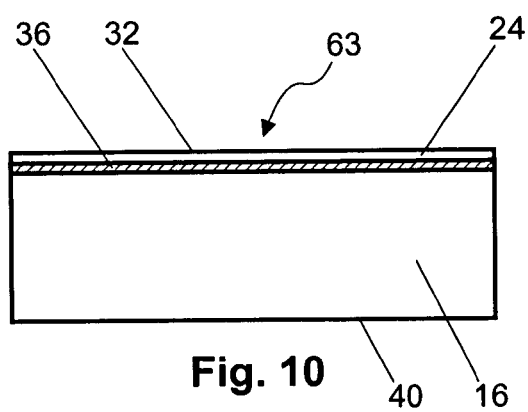
FIG. 10 shows an embodiment of the first portion of a bonded structure after detachment.

Referring to FIG. 9, another embodiment of the invention includes providing an insulator layer or a conductor layer 36 on the receiving substrate 16 and bonding the receiving substrate 16 to the first wafer 15 of FIG. 1, having a region of weakness 18 in the diamond layer 12, to form a bonded structure 62. Preferably, the layer 36 is an insulator layer and includes silica. After bonding, the layer 36 is preferably disposed between the receiving substrate 16 and the surface 14 of the diamond layer 12. After detachment of the bonded structure 62, a first portion 63, as shown in FIG. 10, preferably includes the receiving substrate 16, the layer 36, and the transfer portion 24 having an exposed surface 32.

Figure 11:
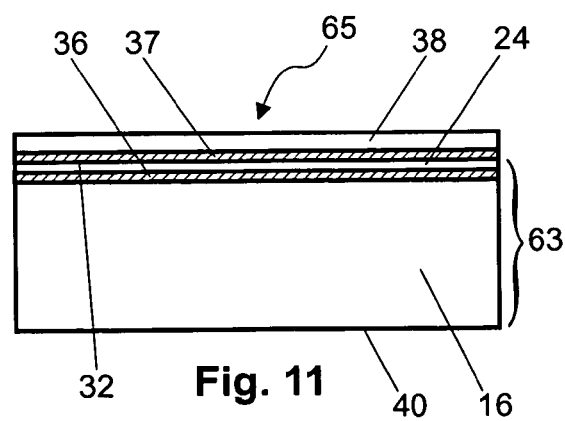
FIG. 11 shows another embodiment of a multilayer first portion of a bonded structure after detachment.

Preferably, the surface 32 of the transfer portion 24 is prepared to achieve a smooth quality and a second insulator or conductor layer 37 is provided thereon, as shown in FIG. 11, to provide a multilayer wafer 65. Preferably, the second layer 37 is also an insulator layer made of silica. More layers can be added to the wafer 65 such as, for example, epitaxially growing a silicon layer 38 on the surface of the second layer 37. In another embodiment, some or all of the layers can also be removed from the wafer 65.

Figure 12:
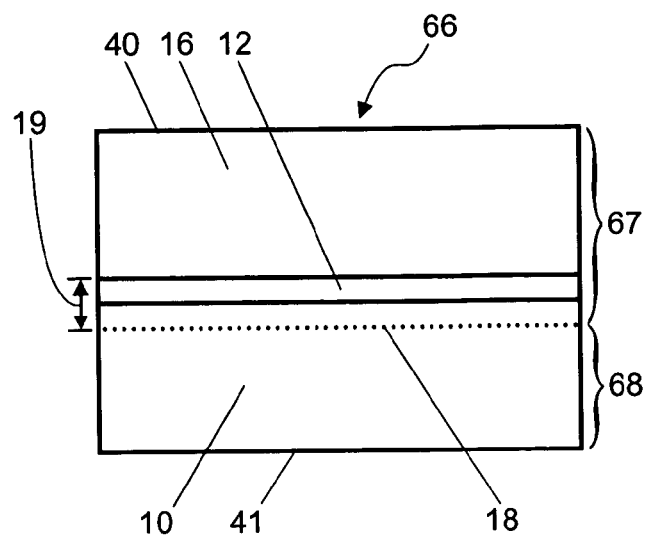
FIG. 12 shows another embodiment of a bonded structure with a region of weakness formed in the support substrate.
Figure 13:
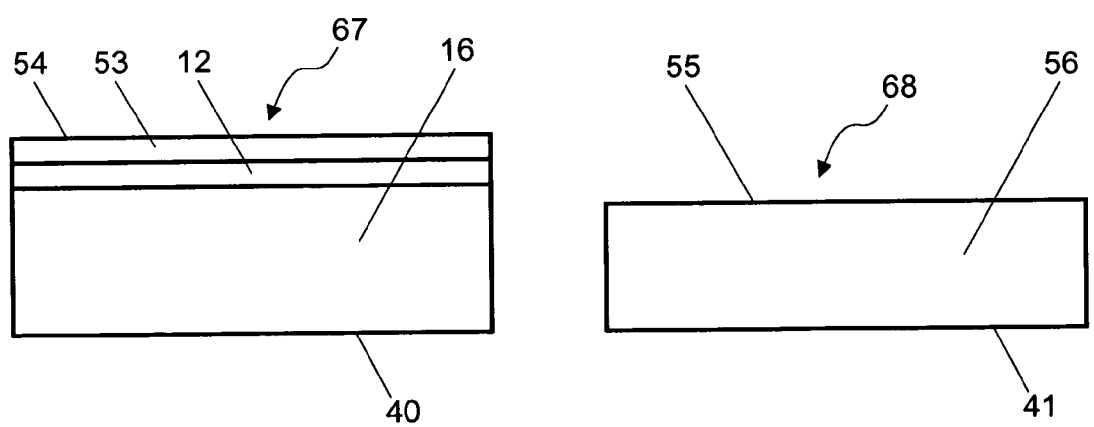
FIG. 13 shows the first and second portions of the bonded structure of FIG. 12 after detachment.

In another embodiment, the region of weakness 18 is formed in the support substrate 10, preferably by implantation of atomic species, and then a receiving substrate 16 is bonded to the diamond layer 12, as shown in FIG. 12, to form a bonded structure 66. As a result of the application of energy to the region of weakness 18, a first portion 67 and a second portion 68 are detached from each other as shown in FIG. 13. The first portion 67 includes the receiving substrate 16, the diamond layer 12, and a transfer portion 53 of the support substrate, which has an exposed surface 54. In this embodiment, the receiving substrate 16 is the handling substrate that is configured for allowing the handling of the diamond layer 12 and the transfer portion 53, which is preferably silicon and is the active layer of the wafer. The second portion 68 includes the remaining portion 56 of the support substrate, which has an exposed surface 55. The surfaces 54,55 can be further smoothed, providing a silicon-on-diamond ("SOD") wafer 67, and can be further prepared for the addition of other layers thereon. For example, another diamond layer, for example, can be grown on the surface 55 of the remaining portion 56 of the support substrate so that the second portion 68 can be used again as a donor wafer according to the present invention. In another embodiment, some or all of the layers can also be removed from the first and second portions 67,68.

Figure 14:
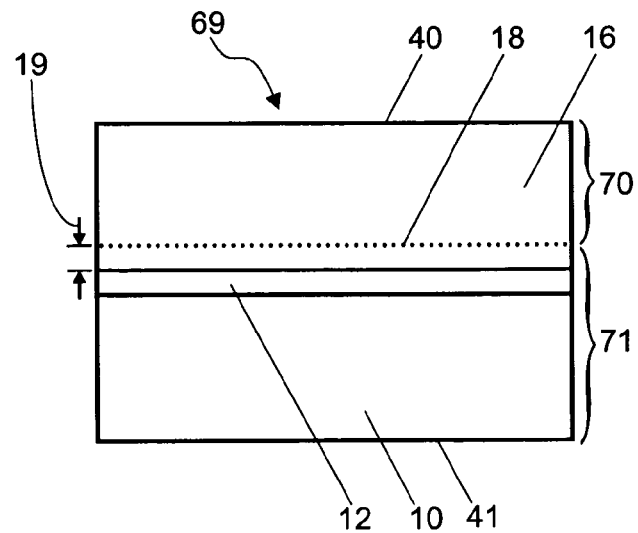
FIG. 14 shows another embodiment of a bonded structure with a region of weakness formed in the bonded substrate.
Figure 15:
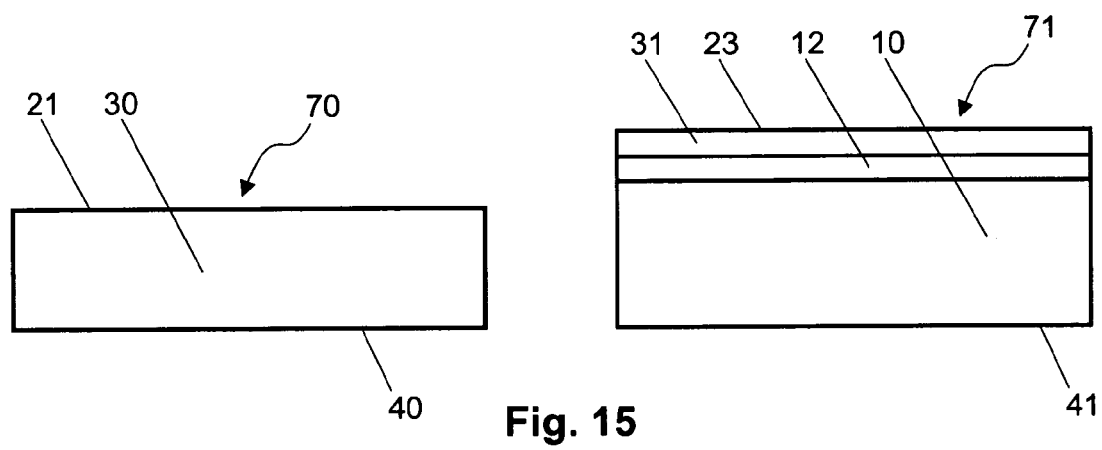
FIG. 15 shows the first and second portions of the bonded structure of FIG. 12 after detachment.

In another embodiment, the region of weakness 18 is formed in the bonded substrate 16, which is preferably then bonded to the diamond layer 12 to form a bonded structure 69, as shown in FIG. 14. Preferably, the bonded substrate 16 includes silicon and the region of weakness 18 is formed by the implantation of atomic species. As a result of the application of energy to the region of weakness 18, a first portion 70 and a second portion 71 are detached from each other as shown in FIG. 15. The first portion 70 includes a remaining portion 30 of the bonded substrate having an exposed surface 21. The second portion 71 includes the support substrate 10, the diamond layer 12, and a bonded portion 31 having an exposed surface 23. In this embodiment, the support substrate 10 is a handling substrate, since it is used to allow handling of the desired portion of the diamond layer 12 after detachment. Also, the combination of the diamond layer 12 and the support substrate 10 is a receiving wafer, since it receives the bonded portion 31, and the remaining portion 30 of the bonded substrate is a donor wafer, since the bonded portion 31 was transferred therefrom.

As in other embodiments described herein, the surfaces 21,23 of both the first portion 70 and the second portion 71 can be smoothed or otherwise prepared to accommodate the addition of other layers thereon. Preferably, preparing the surface 21 of the remaining portion 30 of the bonded substrate enables the first portion 70 to be used again as a bonded substrate 16 in the wafer manufacturing process according to the present invention. Alternatively, some or all of the layers can also be removed from the first and second portions 70,71.

The term "about," as used herein, should generally be understood to refer to both the corresponding number and a range of numbers. Moreover, all numerical ranges herein should be understood to include each whole integer within the range.

While illustrative embodiments of the invention are disclosed herein, it will be appreciated that numerous modifications and other embodiments can be devised by those of ordinary skill in the art. Features of the embodiments described herein, for example adding or removing layers, can be combined, separated, interchanged, and/or rearranged to generate other embodiments. Therefore, it will be understood that the appended claims are intended to cover all such modifications and embodiments that come within the spirit and scope of the present invention.

What is claimed is:

1. A method of manufacturing a wafer comprising:
   providing a surface on a support substrate comprising a first crystalline material other than diamond;
   growing a polycrystalline diamond layer on the surface of the support substrate with a first portion in contact with the support substrate and with a second portion having an exposed surface to provide a first wafer with the polycrystalline diamond layer having a thickness sufficient so that the second portion of the polycrystalline diamond layer includes significantly fewer crystalline grains therein than the first portion of the polycrystalline diamond layer;
   providing a further substrate of a second material that is to be bonded to the first wafer;
   forming a region of weakness either in the first wafer or in the further substrate;
   bonding the further substrate to the first wafer at the exposed surface to provide a bonded structure, such that the region of weakness device first and second bonded structure portions of the bonded structure; and detaching the first bonded structure portion from the second bonded structure portion at the region of weakness to obtain the wafer.

2. The method of claim 1, wherein the diamond layer has a thickness greater than about 10 microns, and the detaching is achieved by applying energy at the region of weakness.

3. The method of claim 1, wherein the first crystalline material is substantially monocrystalline.

4. The method of claim 1, wherein the first crystalline material comprises silicon.

5. The method of claim 1, wherein the second material is crystalline.

6. The method of claim 5, wherein the second material comprises silicon.

7. The method of claim 1, wherein the region of weakness is formed in the first wafer.

8. The method of claim 1, wherein the region of weakness is formed in the further substrate.

9. The method of claim 1, wherein the region of weakness is formed by implanting atomic species.

10. The method of claim 1, wherein the first crystalline material is silicon, silicon dioxide, silicon-germanium compounds, gallium nitride, gallium arsenide, or germanium.

11. The method of claim 1, wherein the region of weakness is formed in the second portion of the polycrystalline diamond layer.

12. A method of manufacturing a wafer, comprising:
providing a support substrate comprising a first crystalline material at a surface thereof;
growing a polycrystalline diamond layer on the surface of the support substrate with a first portion in contact with the support substrate and with a second portion having an exposed surface to provide a first wafer; and
transferring at least a transfer portion of the polycrystalline diamond layer from the first wafer to a further substrate;
wherein the polycrystalline diamond layer has a thickness that is sufficient to define the first and second diamond layer portions of which the second diamond layer portion includes significantly fewer crystalline grains therein than the first diamond layer portion.

13. The method of claim 12, wherein the at least a transfer portion of the polycrystalline diamond layer is transferred to the further substrate by:
forming a region of weakness in the first wafer to define the transfer portion of the polycrystalline diamond layer;
bonding the first wafer at the exposed surface to the further substrate to form a bonded structure; and
transferring the transfer portion at the region of weakness to the further substrate by detachment from a remaining portion of the first wafer.

14. The method of claim 13, further comprising:
providing a third substrate comprising a third crystalline material;
forming a region of weakness in the third substrate to define a transfer portion;
bonding the third substrate to the transfer portion on the further substrate to form a second bonded structure; and
transferring the transfer portion of the third substrate at the region of weakness to the transfer portion of the further substrate by detachment from a remaining portion of the third substrate.

15. The method of claim 12, further comprising reusing the first wafer in the wafer manufacturing process by transferring another portion of the polycrystalline diamond layer of the first wafer to another further substrate.

16. A method of manufacturing a wafer comprising:
providing a surface on a support substrate comprising a first crystalline material;
providing on the surface of the support substrate a transfer layer of a transfer polycrystalline material and having a density of crystalline grains;
growing the transfer layer to provide a first portion in contact with the support substrate and a second portion having an exposed surface to provide a first wafer with the transfer layer having a sufficient thickness such that the second portion of the transfer layer includes significantly fewer crystalline grains therein than the first portion of the transfer layer;
providing a further substrate that is to be bonded to the first wafer;
forming a region of weakness either in the first wafer or in the further substrate;
bonding the further substrate to the first wafer at the exposed surface of the transfer layer to provide a bonded structure, such that the region of weakness defines first and second bonded structure portions of the bonded structure; and
detaching the first bonded structure portion from the second bonded structure portion at the region of weakness to obtain the wafer.

17. The method of claim 16, wherein:
the first crystalline material comprises silicon;
the transfer polycrystalline material comprises diamond; and
the further substrate comprises silicon.

18. The method of claim 16, wherein the polycrystalline transfer material comprises diamond.

19. The method of claim 16, wherein the transfer polycrystalline material is silicon carbide or gallium nitride.

* * * * *

UNITED STATES PATENT AND TRADEMARK OFFICE
CERTIFICATE OF CORRECTION

PATENT NO. : 7,605,055 B2  Page 1 of 1
APPLICATION NO. : 11/142345
DATED : October 20, 2009
INVENTOR(S) : Celler It is certified that error appears in the above-identified patent and that said Letters Patent is hereby corrected as shown below:

Title Page:
Item (56), References Cited, Other Publications, Aspar et al. reference, after "The generic" change "natrue" to -- nature --.

Column 8:
Line 66 (claim 1, line 19), change "device" to -- defines --.

Signed and Sealed this

Twenty-fourth Day of November, 2009

David J. Kappos
*Director of the United States Patent and Trademark Office*